US011093665B2

United States Patent
Ringgenberg

(10) Patent No.: US 11,093,665 B2
(45) Date of Patent: Aug. 17, 2021

(54) SYSTEM AND METHOD FOR SIMULATION VISUALIZATION

(71) Applicant: Lockheed Martin Corporation, Bethesda, MD (US)

(72) Inventor: Kyle M. Ringgenberg, Fort Worth, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 601 days.

(21) Appl. No.: 15/793,171

(22) Filed: Oct. 25, 2017

(65) Prior Publication Data

US 2019/0121923 A1    Apr. 25, 2019

(51) Int. Cl.
| | |
|---|---|
| *G06F 30/20* | (2020.01) |
| *G06F 17/40* | (2006.01) |
| *G06F 3/048* | (2013.01) |
| *G06T 11/20* | (2006.01) |
| *G06T 13/80* | (2011.01) |
| *G06T 15/00* | (2011.01) |

(52) U.S. Cl.
CPC .............. *G06F 30/20* (2020.01); *G06F 3/048* (2013.01); *G06F 17/40* (2013.01); *G06T 11/20* (2013.01); *G06T 13/80* (2013.01); *G06T 15/005* (2013.01)

(58) Field of Classification Search
CPC .......... G06F 30/20; G06F 3/048; G06F 17/40; G06F 17/5009; G06F 17/50; G06F 30/00; G06T 15/005; G06T 13/80; G06T 11/20
USPC ........................................................... 703/6
See application file for complete search history.

(56) References Cited

U.S. PATENT DOCUMENTS

| | | | | |
|---|---|---|---|---|
| 2010/0321391 A1* | 12/2010 | Rubin | ................... | G06T 11/206 345/441 |
| 2013/0124175 A1* | 5/2013 | McKim | ................ | G09B 19/003 703/6 |
| 2014/0005990 A1* | 1/2014 | Kuboi | ..................... | G06F 30/20 703/2 |
| 2015/0006128 A1* | 1/2015 | Enenkel | ................. | G06F 30/18 703/2 |
| 2015/0149131 A1* | 5/2015 | Kuboi | ..................... | G06F 30/20 703/2 |
| 2016/0077810 A1* | 3/2016 | Bertilsson | ................ | G06F 8/35 717/105 |

* cited by examiner

*Primary Examiner* — Cedric Johnson
(74) *Attorney, Agent, or Firm* — Baker Botts L.L.P.

(57) ABSTRACT

A disclosed method for simulation visualization may include determining initial conditions for a control logic component for modeling and simulating of a physical product or process. The method may also include determining initial conditions for a render engine for generating a visualization of outputs of the control logic component. The method may include initiating execution of the control logic component and the render engine in accordance with the determined initial conditions, and receiving, during a simulation, input from the control logic component in accordance with a predefined interface for simulation visualization. The received input may represent one or more outputs of the control logic component. The method may also include communicating the received input to the render engine in accordance with the predefined interface for visualization by the render engine.

19 Claims, 5 Drawing Sheets

SYSTEM AND METHOD FOR SIMULATION VISUALIZATION

TECHNICAL FIELD

This disclosure relates in general to modeling and simulation of technological products and processes, and more particularly to systems and methods for simulation visualization.

BACKGROUND

The complexities of designing and operating modern technological products almost universally necessitate the need for modeling and simulation. Advanced systems require modeling and simulation efforts of ever-larger breadth and depth, while they process exponentially increasing amounts of data. These data must be visualized in a meaningful way to be useful to the designers, engineers, or end users of the products or processes.

A wide variety of industries, including aerospace, automotive, healthcare, and others, have moved to, or are moving towards, simulation-based engineering approaches. Modeling and simulation visualization is generally approached from the perspective of a specific product implementation or technology domain such as, for example, an aircraft flight simulation.

SUMMARY OF THE DISCLOSURE

According to one embodiment, a method for simulation visualization may include determining initial conditions for a control logic component for modeling and simulating of a physical product or process. The method may also include determining initial conditions for a render engine for generating a visualization of outputs of the control logic component. The method may include initiating execution of the control logic component and the render engine in accordance with the determined initial conditions, and receiving, during a simulation, input from the control logic component in accordance with a predefined interface for simulation visualization. The received input may represent one or more outputs of the control logic component. The method may also include communicating the received input to the render engine in accordance with the predefined interface for visualization by the render engine.

Technical advantages of certain embodiments may include a dramatic reduction in the engineering effort required to build and modify simulation visualizations, since the creation and maintenance of custom interfaces between specific pairs of modeling and simulation control logic components and render engines are not required. Technical advantages of certain embodiments may also include a dramatic reduction in the engineering effort required to extend simulation virtualization environments to include additional modeling and simulation control logic components and/or render engines, as such extensions do not require any modifications to the program instructions for modeling and simulation control logic components and/or render engines that already exist in the environment. For example, the simulation virtualization environments described herein may include mechanisms that allow a simulation environment to perform simulation visualization using modeling and simulation control logic components and render engines that are agnostic with respect to one another. These mechanisms, embodied in a simulation visualization platform controller, may further allow modeling and simulation control logic components and/or render engines operating within the simulation environment to be replaced, interchanged, augmented, or otherwise modified without having any effect on each other and without the need to modify existing modeling and simulation control logic components and/or render engines in response to such changes.

The simulation visualization platform controller may allow additional modeling and simulation control logic components and/or render engines to be added to the simulation environment without modification to existing applications, and may allow the simultaneous simulation of one or multiple applications visualized within one or multiple render engines. The simulation visualization platform controller may automatically manage interdependencies between, and control of, disparate simulation models and visualization tools.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DISCLOSURE

Figure 1:
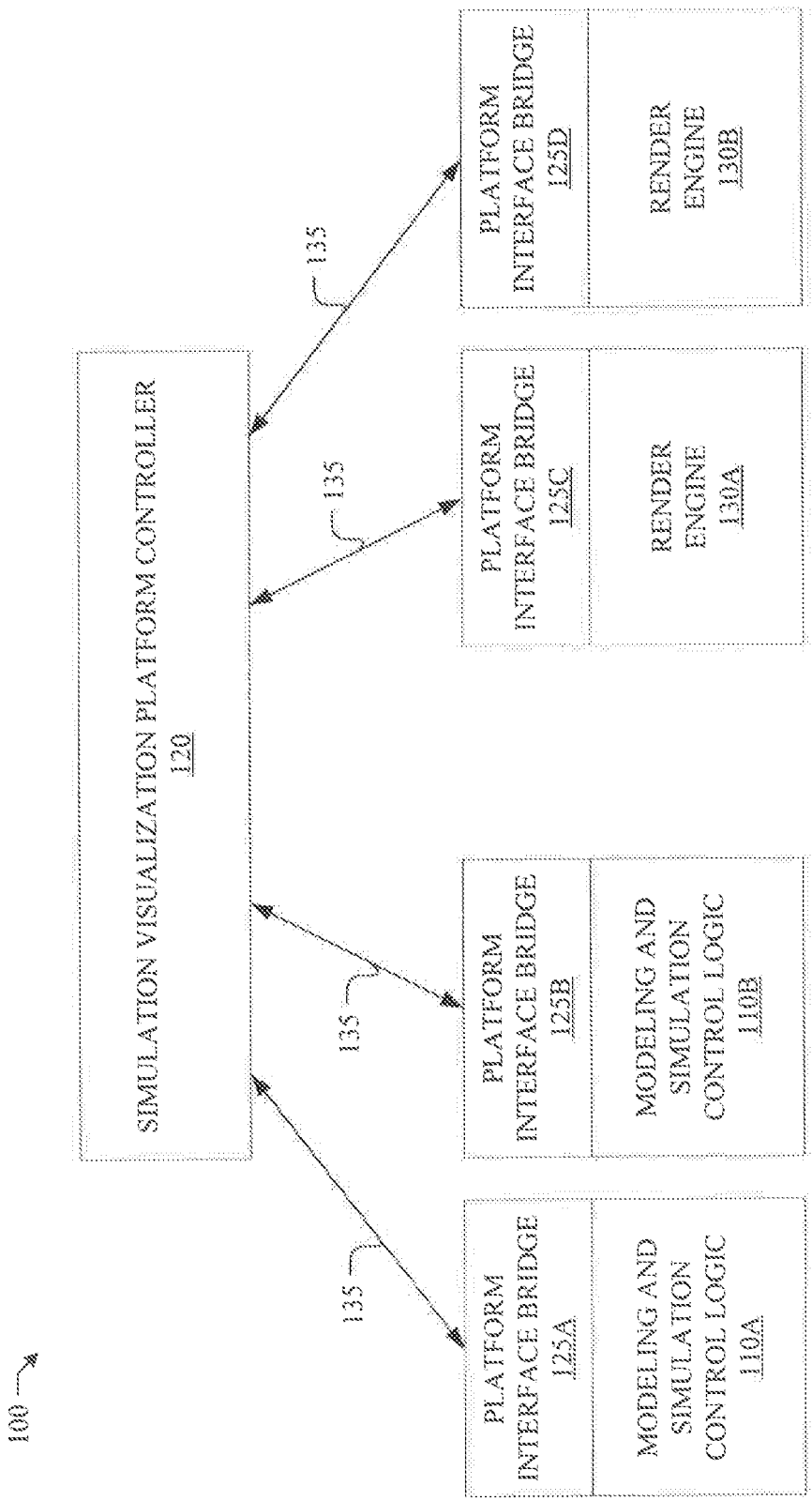
FIG. 1 illustrates a system for simulation visualization, according to certain embodiments.

Many industries, including aerospace, automotive, healthcare, and others have moved to, or are moving towards, simulation-based engineering. For example, within the realm of aircraft design, a considerable degree of modeling and simulation must be performed to develop and validate the systems that govern the aerodynamic behavior of the vehicle.

Traditionally, simulation visualization requires that a connection between a modeling and simulation control logic component and a render engine is hard-coded to support the exchange of information between these two applications. For example, a connection may be hard-coded to support the particular file formats, application programming interfaces (APIs), or other constraints on the data exchanged between a particular modeling and simulation control logic component and a particular render engine. With this tight coupling between the applications, any change to either requires a compensating change to the other. This introduces considerable inefficiencies when using simulation visualization in the design process for complex technological products and processes and limits the extensibility of the simulation environment.

The teachings of the disclosure recognize that by abstracting away the uniqueness of modeling and simulation control logic components and render engines, a simulation environment including a simulation visualization platform controller that implements a defined platform interface may perform simulation visualization using modeling and simulation control logic components and render engines that are agnostic with respect to one another. The disclosed techniques may be used to build and control applications for performing simulation visualization within simulation environments that are highly flexible and extensible.

Technical advantages of the disclosed techniques may include a dramatic reduction in the engineering effort required to build and modify simulation visualizations, since the creation and maintenance of custom interfaces between specific pairs of modeling and simulation control logic components and render engines are not required. Technical advantages of certain embodiments may also include a dramatic reduction in the engineering effort required to extend simulation virtualization environments to include additional modeling and simulation control logic components and/or render engines, as such extensions do not require any modifications to the program instructions for modeling and simulation control logic components and/or render engines that already exist in the environment.

In some embodiments, a system for simulation visualization may include one or more modeling and simulation control logic components, each of which may include program instructions that, when executed by one or more processors, simulate at least a portion of the operating of a physical system in accordance with various physical and engineering constraints on the system. For example, in a simulation of a projectile, a modeling and simulation control logic component may be configured to determine the flight path of the projectile using calculations based on gravitational constants, wind resistance, the initial position and velocity of the projectile, the size, shape, and weight of the projectile, the presence of other objects in the vicinity of the projectile and the flight path, and/or other information. However, the modeling and simulation control logic component may not know anything about what the area surrounding the flight path of the projectile looks like nor about what the projectile itself looks like.

In some embodiments, a system for simulation visualization may include one or more render engines to provide a visualization mechanism for displaying the outputs of the modeling and simulation control logic components (e.g., the simulation results) in a way that is meaningful to a human user. Each of the render engines may be agnostic as to any underlying physics or complex mathematical elements associated with the simulation or the modeling and simulation control logic components. In the example simulation of a projectile described above, whereas the modeling and simulation control logic component knows about the gravitational constants, wind resistance, the initial position and velocity of the projectile, the size, shape, and weight of the projectile, and/or the presence of other objects in the vicinity of the projectile and the flight path, the render engine does not. However, the render engine may know what the area surrounding the flight path of the projectile looks like and/or what the projectile itself looks like, and may know how to draw these elements of the simulation model within a visualization that depicts the calculated flight path.

In some embodiments, a system for simulation visualization may include a simulation visualization platform controller. The modeling and simulation control logic components and the render engines may communicate with each other using a defined interface of the simulation visualization platform controller, which acts as a third-party communication broker between the applications. In this way, the modeling and simulation control logic components remain agnostic with respect to the render engines, and vice versa.

In some embodiments, any of the modeling and simulation control logic components and the render engines with the simulation visualization environment can be modified or replaced without impacting any of the others. For example, the modeling and simulation control logic components and the render engines may be used in different combinations to provide a visualization of a simulation without having to write, or re-write, program code to directly translate the outputs from one application to serve as inputs for another application for each such combination. In some embodiments, this approach may allow product designers to focus on their own technologies rather than on integrating their simulations with the visualization infrastructure.

The following describes systems and methods of simulation visualization for providing these and other desired features.

FIG. 1 illustrates a system 100 for simulation visualization, according to certain embodiments. System 100 includes a simulation visualization platform controller 120, multiple modeling and simulation control logic components 110, and multiple render engines 130.

In various embodiments, modeling and simulation control logic components 110 may be implemented using any of a variety of commercially available modeling and simulation tools or platforms including, without limitation, one or more MATLAB® or Simulink® simulation tools developed by The Mathworks, Inc. or LabVIEW® simulation tools developed by National Instruments, or using any of a variety of proprietary or custom modeling and simulation tools or platforms written in the C or C++ programming languages or any other suitable programming language. For example, the modeling and simulation control logic components 110 for a simulation visualization used in aircraft design may implement a flight-dynamics model, which may include numerous applications governing equations of motion, thrust, pilot input, and other factors that affect the behavior of an aircraft.

In various embodiments, render engines 130 may be implemented using any of a variety of commercially available visualization tools or platforms or using any of a variety of custom visualization tools or platforms written in the C or C++ programming languages or any other suitable programming language. For example, the render engines 130 for a simulation visualization used in aircraft design may include, without limitation, the Google Earth™ mapping service, Prepar3D® simulation software developed by Lockheed Martin Corporation, the Vega Prime visualization software toolkit developed by Presagis, the Unreal® Engine suite of development tools developed by Epic Games, Inc., and/or one or more proprietary or custom visualization applications.

In some embodiments, simulation visualization platform controller 120 may be configured, to act as a third party broker through which modeling and simulation control logic components 110 and render engines 130 communicate using a defined interface 135 for the simulation visualization platform. In some embodiments, simulation visualization platform controller 120 may be agnostic as to the implementation of the various modeling and simulation control logic components 110, supporting any suitable modeling and simulation control logic component 110 by way of a respective plugin interface that encapsulates all model-specific operational logic (e.g., logic related to trim conditions, environmental factors, etc.). In some embodiments, simulation visualization platform controller 120 may be agnostic as to the implementation of the various render engines 130, supporting any suitable render engine 130 by way of a respective plugin interface that encapsulates all view-specific operational logic (e.g. logic related to visual quality, content path, etc.). Each of the plugins may be implemented within a dynamically loaded, use-case-specific expansion library. As described in more detail below, a lightweight software module implementing the defined platform interface 135 may be embedded into each platform interface bridge 125.

In some embodiments, simulation visualization platform controller 120 may be agnostic as to the underlying transport protocol implementation, supporting any suitable transport protocol by way of a respective plugin interface. In some embodiments, simulation visualization platform controller 120 may be configured to manage the health and state of all subordinate processes, including various modeling and simulation control logic components 110 and render engines 130.

In some embodiments, simulation visualization platform controller 120 may be configured to manage, in a centralized manner, human interface controls. For example, simulation visualization platform controller 120 may include human interface controls for supporting real-time interaction with the various modeling and simulation control logic components 110 to direct a simulation (e.g., to change its behavior in real time) or human interface controls for supporting real-time interaction with the various render engines to modify the way in which outputs of the simulation are visualized. For example, input received by simulation visualization platform controller 120 through a human interface device during an interactive simulation may specify a value of an operating parameter or a value of a control parameter for a modeling and simulation control logic component 110 that changes the behavior of the simulation. In some embodiments, simulation visualization platform controller 120 may also include human interface controls for configuring the underlying modeling and simulation control logic components 110 and render engines 130. For example, in a simulation visualization used in aircraft design, simulation visualization platform controller 120 may include human interface controls for trim-condition editing.

Each of the modeling and simulation control logic components 110 and render engines 130 may include, or be coupled to, a platform interface bridge 125 through which it exchanges information with simulation visualization platform controller 120 using a defined interface 135 over a communication protocol such as a local data transport protocol or TCP/IP. In some embodiments, the implementation of the platform interface bridge 125 through which a modeling and simulation control component 110 exchanges information with simulation visualization platform controller 120 may be the same manner as the implementation of the platform interface bridge 125 through which a render engine 130 exchanges information with simulation visualization platform controller 120, where the difference between the two platform interface bridges 125 is in the configuration of the direction of data flow selected when the bridge are instantiated.

In some embodiments, program instructions that when executed by one or more processors of the computing systems on which the modeling and simulation control logic components 110 and render engines 130 execute may define a bridge component class for which there are multiple bridge types, including a control logic type and a render engine type. The program instructions may define functions for buffering data to and from an underlying memory mechanism that are called once per frame to update the input/output data. The program instructions may also include functions to access incoming data, including key-value pairs and metadata, from an input memory block (frame) and functions for adding outgoing key-value-pair data to an output memory block (frame).

Although two modeling and simulation control logic components 110 and two render engines 130 are illustrated in FIG. 1, system 100 may include a single modeling and simulation control logic component 110, a single render engine 130, or any other number of modeling and simulation control logic components 110 and render engines 130, in different embodiments.

In some embodiments, prior to executing a simulation visualization using a particular modeling and simulation control logic component 110 and a particular render engine 130, the following operations may be performed:

Optimize the particular modeling and simulation control logic component 110 for real-time operation Embed a platform interface bridge 125 into the particular modeling and simulation control logic component 110

Generate and/or update an appropriate plugin for the particular modeling and simulation control logic component 110

Generate render-engine-specific graphics for the visualization

Generate and/or update an appropriate plugin for the particular render engine

Subsequently, system 100 may be configured to execute the simulation visualization using the components described above. More specifically, simulation visualization platform controller 120 may manage the execution of the particular modeling and simulation control logic component 110 and the particular render engine 130 to perform the simulation visualization.

In some embodiments, when the simulation visualization platform controller 120 process is spawned, specifying a particular modeling and simulation control logic component 110 and a particular render engine 130, the simulation visualization platform controller 120 may perform a search for the specified applications and may configure them according to inputs received through an interface of the simulation visualization platform controller 120. The simulation visualization platform controller 120 may then provide the appropriate values to the applications via the defined key-value-pair mechanism to launch the simulation, to pause the simulation, to restart the simulation and/or to stop the simulation. In some embodiments, while the simulation is running, the simulation visualization platform controller 120 may manage local and distributed communications between the particular modeling and simulation control logic component 110 and the particular render engine 130, and may record the communications for subsequent playback.

In one example embodiment, the disclosed techniques may be used to build a simulation visualization environment for aircraft design. The simulation visualization environment may allow the modeling and simulation control logic for any aircraft simulation to be readily visualized in any flight simulator as long as both adhere to the defined platform interface. For example, a modeling and simulation control logic component may publish, through the defined platform bridge, key-value pairs representing the latitude, longitude, altitude, roll, pitch, and yaw of an aircraft during a simulation. The simulation visualization platform controller may read the published key-value pairs, either locally or over a network (such as a User Datagram Protocol (UDP) network), collect and organize the key-value pairs, perform unit conversions on the values, where appropriate, and communicate the key-value pairs to a render engine that exists within the simulation visualization environment.

In this example embodiment, either application can be replaced with no modification to the other. For example, the modeling and simulation control logic for an F-16 aircraft simulation may be replaced with the modeling and simulation control logic for an F-35 aircraft simulation, or a visualization based on the Google Earth™ mapping service may be replaced by a visualization based on Prepar3D® simulation software. Additional modeling and simulation control logic components or render engines may be added to the simulation visualization environment without the need to modify the existing applications. This may allow, for example, the simultaneous simulation of both an F-16 aircraft and an F-35 aircraft that are visualized using both the Google Earth™ mapping service and Prepar3D® simulation software.

Figure 2:
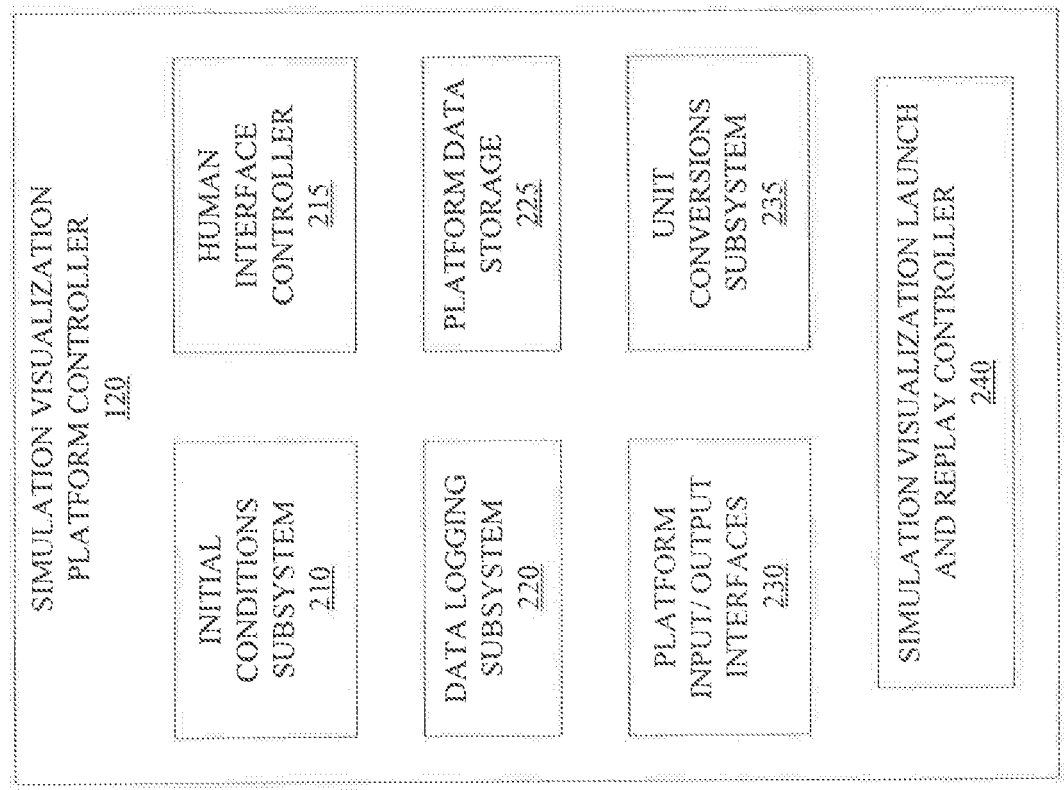
FIG. 2 illustrates an example of a simulation visualization platform controller of FIG. 1, according to certain embodiments.

FIG. 2 illustrates an example of a simulation visualization platform controller 120 of FIG. 1, according to certain embodiments. In this example, simulation visualization platform controller 120 includes initial conditions subsystem 210, human interface controller 215, data logging subsystem 220, platform data storage 225, multiple platform input/output interfaces 230, unit conversions subsystem 235, and simulation visualization launch, and replay controller 240.

In some embodiments, human interface controller 215 may be configured to communicate with any of a variety of human interface devices that are connected to a system executing simulation visualization. For example, human interface controller 215 may be configured to communicate with any devices that are compliant with the Human Interface Device (HID) protocol standard, such as HID-compliant USB devices, and to translate the input received through those devices into key-value pairs. These key-value pairs may then be published to any modeling and simulation control logic components that may be running on the system.

In some embodiments, all control functions for simulation visualization may take place through the simulation visualization platform controller. For example, some modeling and simulation control logic components require real-time user input (e.g., input received through a joystick for a flight simulation), and these inputs may be handled automatically by human interface controller 215. These and other inputs may be received through a single, user-centric graphical user interface (GUI) managed, by human interface controller 215. In some embodiments, the GUI provided by human interface controller 215 may include an integrated data display GUI and/or an integrated, message logger GUI.

In some embodiments, the GUI may include a first interface module for managing modeling and simulation control logic components, a second interface module for managing render engines, and a third interface module for managing the exchange of data between one or more modeling and simulation control logic components, and one or more render engines. The first interface may include user interface elements for selecting a particular modeling and simulation control logic component from which to receive data to be visualized and/or for configuring its behavior upon power-off or error conditions.

Similarly, the second interface may include user interface elements for selecting a particular render engine to which the data is to be communicated and/or for configuring its behavior upon power-off or error conditions. The third interface may include user interface elements for selecting a data transport protocol over which to provide data to a selected render engine and/or a frame rate at which the data is to be communicated. In some embodiments, the GUI may include a fourth interface for controlling the selected simulation and its visualization including, for example, start, stop, pause, and/or replay controls.

Other user interface modules within the GUI may be useable to define or assign inputs received through a joystick or other human interface device to various control signals within a simulation or its visualization, to define initial conditions of various control signals within a simulation or its visualization, to save and/or load initial conditions data, and/or to select the units in which the values of various control signals are to be represented when displayed in the visualization (e.g., units into which the values of various control signals are to be converted for use in the visualization).

Still other user interfaces within the GUI may display a history of ail messages (e.g., all key-value pairs) exchanged between the applications. For example, the GUI may include an interface within which the key-value pairs can be organized and/or converted to different units, where appropriate. This interface may facilitate the debugging of a simulation in that it may allow a user to see what the values of specific control signals were at particular points in the simulation.

In some embodiments, initial conditions subsystem 210 may provide a central mechanism for specifying any or all initial conditions for various modeling and simulation control logic components and/or render engines, for defining interdependencies between initial conditions, and/or for defining valid ranges for particular control signals. In some embodiments, the logic for setting the initial conditions, as defined through initial conditions subsystem 210, may reside in the plugins associated with the modeling and simulation control logic components and/or render engines to which they apply. In some embodiments, the initial conditions data specified through initial conditions subsystem 210 may be published, via the defined key-value-pair mechanism, to the modeling and simulation control logic components and/or render engines running on the system. In this manner, the simulation and corresponding visualization applications may start in a known good state.

In some embodiments, there may be a default initial state for a given modeling and simulation control logic component and/or render engine that, in the absence of input to the contrary, may allow the application to start in a known and rational initial condition. In some embodiments, initial conditions subsystem 210 may be configured to save the initial conditions defined for a given simulation visualization (e.g., in an initial conditions log) and to support modifications to those initial conditions. In some embodiments, by saving the specific initial conditions for a series of different simulation visualization runs, the series of runs may be executed in a batch mode, under the direction of the simulation visualization platform controller, with each run using a respective set of initial conditions.

In some embodiments, data logging subsystem 220 may be configured to record all data exchanged between the simulation visualization platform controller and the modeling and simulation control logic components and/or render engines during the simulation visualization. For example, every key-value pair that is communicated from any number of modeling and simulation control logic components over to one or more render engines may be logged by data logging subsystem 220. In some embodiments, there may be situations in which a render engine sends data (in the form of a key-value pair) back to a modeling and simulation control logic component. For example, in flight simulation, a render engine may be aware of the buildings or other objects in a three-dimensional scene, and may send data representing those buildings or other objects back to a modeling and simulation control logic component so that it can respond appropriately. Key-value pairs exchanged in this alternate direction may also be logged by logging subsystem 220.

In some embodiments, platform data storage 225 may store initial conditions data (e.g., default or run-specific initial conditions data), logged data exchanges (e.g., key-value pairs), user inputs received during a simulation visualization, and/or any other data associated with the applications within a simulation visualization environment or a particular simulation visualization run.

In some embodiments, each platform interface bridge associated with a modeling and simulation control logic component or render engine may include storage for key-value pairs that are exchanged between the modeling and simulation control logic component or render engine and the simulation visualization platform controller. In one example embodiment, each platform interface bridge may include storage for one input memory block (or frame) and one output memory block (or frame). Each input memory block or output memory block may include 128 key-value pairs and may be keyed by an entity identifier. Each key-value pair may be a 32-byte value, including a 24-byte keyword and an 8-byte value. In other embodiments, a different number of key-value pairs may be included in each stored block (or frame) and/or each key-value pair may include a different number of bytes. In some embodiments, the simulation visualization platform controller may also store metadata articulating an entity id, a name, and/or a count of key-value pairs exchanged.

In some embodiments, multiple platform input/output interfaces 230 may send and receive key-value pairs that are exchanged between modeling and simulation control logic components and/or render engines and the simulation visualization platform controller in accordance with a unified communication protocol. For example, all data exchanged between these applications may use a common messaging scheme based on key-value pairs. In some embodiments, one or more of platform input/output interfaces 230 may be configured to export data (e.g., to a file) as Comma-Separated Values (CSV) or in a data format compatible with a particular modeling and simulation control logic component or render engine (e.g., as MATLAB formatted data).

In some embodiments, unit conversions engine 235 may be configured, to convert the values of various control signals received from a modeling and simulation control logic component as key-value pairs to different units before the key-value pairs are passed to a render engine for visualization. For example, the render engine may not support all of data types or data formats in which data is output from the modeling and simulation control logic component. Unit conversions engine 235 may be configured to convert various values from a data type or data format that is unsupported in the render engine to a data type or data format that is supported in the render engine. In some embodiments, unit conversions engine 235 may be configured to convert various values from one scale to another (e.g., from metric to U.S. units) or to a value having a different number of significant digits.

In some embodiments, simulation visualization launch and replay controller 240 may be configured to manage the execution of particular simulation visualization runs. For example, in some embodiments, simulation visualization launch and replay controller 240 may support dynamic attachment of the simulation visualization platform controller to modeling and simulation control logic components and/or render engines. In some embodiments, simulation visualization launch and replay controller 240 may provide functionality to spawn, manage, or kill the processes that implement various modeling and simulation control logic components and/or render engines. In some embodiments, simulation visualization launch and replay controller 240 may be configured, to manage all external start, pause, restart, and/or stop controls for various modeling and simulation control logic components and/or render engines. In some embodiments, simulation visualization launch and replay controller 240 may be configured to automatically locate and validate ail dependencies between various modeling and simulation control logic components and render engines.

In some embodiments in which data logging subsystem 220 is configured to record all data exchanged between the simulation visualization platform controller and the modeling and simulation control logic components and/or render engines during simulation visualization, a complete record of what was happening within the simulation at any given point in time (e.g., a full CSV file) may be available after a simulation run is complete. In some embodiments, simulation visualization launch and replay controller 240 (or another subsystem or plugin module) may be configured to allow the data that was recorded (or cached) to be loaded and replayed at various speeds. For example, the replayed simulation may be slowed down, sped up, moved forward or moved in reverse so that a user can understand, using a visual perspective, what was going on inside the modeling and simulation control logic without having to re-execute that logic.

In some embodiments, simulation visualization launch and replay controller 240 may be configured to cause (or allow) a modeling and simulation control logic component to run independently of any other application in the same simulation visualization environment, including any render engines.

As previously noted, a simulation visualization environment that includes one or more simulation visualization platform controllers and implements the techniques described herein may be highly extensible. For example, new modeling and simulation control logic components, render engines, or user-requested platform-level features may be added without the need to modify existing applications within the environment other than the simulation visualization platform controller(s), and without the need for recompilation of the components of the environment.

In some embodiments, adding a new modeling and simulation control logic component may include embedding a platform interface bridge into the component (or coupling a platform interface bridge to the component) to translate the native outputs of the component to key-value pairs in accordance with a defined platform interface. In some embodiments in which a modeling and simulation control logic component does not generate visualization data, adding the component may include embedding a platform interface bridge into the component (or coupling a platform interface bridge to the component) to translate a CSV file into key-value pairs in accordance with a defined platform interface.

In some embodiments, adding a new render engine may include embedding a platform interface bridge into the application (or coupling a platform interface bridge to the application) to translate key-value pairs in accordance with a defined platform interface to inputs in the native formats of the render engine.

In some embodiments, a software development kit (SDK) associated with a simulation visualization platform controller may provide templates for commonly used modeling and simulation languages including, without limitation, C/C++ and various MATLAB® or Simulink® simulation tools. In some embodiments, an SDK associated with a simulation visualization platform controller may provide templates and scripts for generating visual content.

In some embodiments, the number of modeling and simulation control logic components that may be simultaneously executed within the simulation visualization environments described herein may be limited only by computing hardware (e.g., by processing power). In some embodiments, the number of render engines that may be simultaneously executed within the simulation visualization environments described herein may be limited only by computing hardware (e.g., by processing power).

Figure 3:
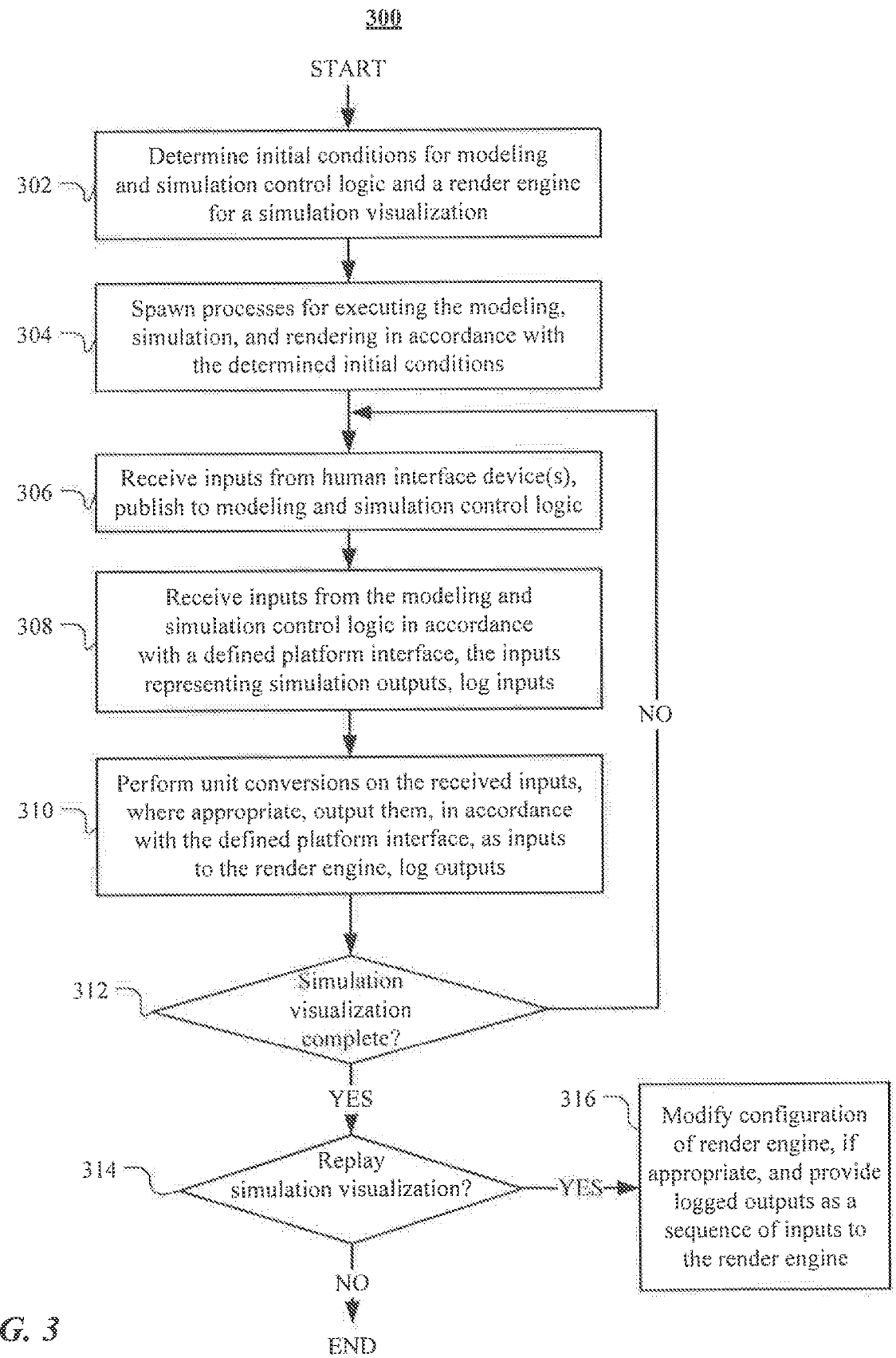
FIG. 3 illustrates a method for performing simulation visualization, according to certain embodiments.

FIG. 3 illustrates an example method 300 for performing simulation visualization, according to certain embodiments. In some embodiments, method 300 may be performed by a simulation visualization platform controller, such as simulation visualization platform controller 120 described above, or by multiple simulation visualization platform controllers. Method 300 may begin and, in step 302, may include determining initial conditions for modeling and simulation control logic and a render engine for a simulation visualization run. For example, the method may include identifying a default set of initial conditions, receiving user input specifying one or more initial conditions, or accessing a stored set of initial conditions used in an earlier run (e.g., when replaying a simulation). Various ones of the initial conditions may be specific to a particular modeling and simulation control logic component or render engine, or may be common across multiple modeling and simulation control logic components or render engines.

In step 304, the method may include spawning processes for executing the modeling, simulation, and rendering in accordance with the determined initial conditions. For example, a simulation visualization launch and replay controller may spawn the processes that implement the various modeling and simulation control logic components and/or render engines and initial conditions data specified through an initial conditions subsystem may be published, via the defined key-value-pair mechanism, to the modeling and simulation control logic components and/or render engines.

In step 306, the method may include receiving inputs from one or more human interface devices, and publishing the inputs to various modeling and simulation control logic components to direct an interactive simulation. In some embodiments, the human interface devices may be communicatively coupled to the simulation visualization platform controller through a human interface controller subsystem of the simulation visualization platform controller. In some embodiments, the inputs may be converted to different units and/or scaled prior to publishing, where appropriate.

In step 308, the method may include receiving inputs from the modeling and simulation control logic in accordance with a defined platform interface, where the inputs represent simulation outputs to be visualized by a render engine. The method may also include logging the received inputs for use during a subsequent simulation visualization run (e.g., during a replay of the simulation visualization).

In step 310, the method may include performing unit conversions on the received inputs for compatibility with the render engine through which they will be visualized, where appropriate. The method may also include outputting the received inputs (some of which may have been converted to different units), in accordance with the defined platform, interface, as inputs to the render engine. The method may also include logging the outputs for use during a subsequent simulation visualization run (e.g., during a replay of the simulation visualization).

If, in step 312, it is determined that the simulation visualization is complete, method 300 may proceed to 314. Otherwise, method 300 may return to 306, after which the operations shown in steps 306 to 310 may be repeated one or more times until the simulation visualization is complete.

If, in step 314, it is determined that the simulation visualization should be replayed, method 300 may proceed to 316. Otherwise, method 300 may end. For example, the simulation visualization may be replayed in order to analyze or debug the underlying modeling and simulation control logic, or in order to execute a series of simulation visualization runs using the same simulation output data but different visualization, parameters. At step 316, the method may include modifying the configuration of the render engine, if appropriate, and providing the previously logged outputs as a sequence of inputs to the render engine.

Particular embodiments may repeat one or more steps of the method of FIG. 3, where appropriate. For example, the operations shown in step 316 may be repeated one or more times, as appropriate, in response to input received by the simulation visualization platform controller (e.g., input received from a user through an HID device or GUI, or from a batch script). Although this disclosure describes and illustrates particular steps of the method of FIG. 3 as occurring in a particular order, this disclosure contemplates any suitable steps of the method of FIG. 3 occurring in any suitable order. Moreover, although this disclosure describes and illustrates an example method for performing simulation visualization, using a simulation visualization platform controller, including the particular steps of the method of FIG. 3, this disclosure contemplates any suitable method for performing simulation visualization using a simulation visualization platform controller including any suitable steps, which may include all, some, or none of the steps of the method of FIG. 3, where appropriate. Furthermore, although this disclosure describes and illustrates particular components, devices, or systems carrying out particular steps of the method of FIG. 3, this disclosure contemplates any suitable combination of any suitable components, devices, or systems carrying out any suitable steps of the method of FIG. 3.

In some embodiments, the simulation visualization environments described herein may not be limited to implementations on a single computing system, but may be distributed across multiple computing systems that are communicatively coupled to each other over a network and/or through a shared memory, each of which includes an instance of a simulation visualization platform controller (or a portion thereof). In some embodiments, transport plugins associated with each simulation visualization platforms controller instance may be configured to transparently propagate data to and from one or more other simulation visualization platform controllers executing in respective computing systems. For example, in some embodiments, each simulation visualization platform controller instance may be configured to publish data to a UDP broadcast network from which it may be retrieved by one or more other simulation visualization platform controller instances executing on respective remote computing systems for the benefit of various modeling and simulation control logic components and/or render engines executing on the remote computing systems. In some embodiments, distributed instances of a simulation visualization platform controller may communicate with each other to synchronize data.

Figure 4:
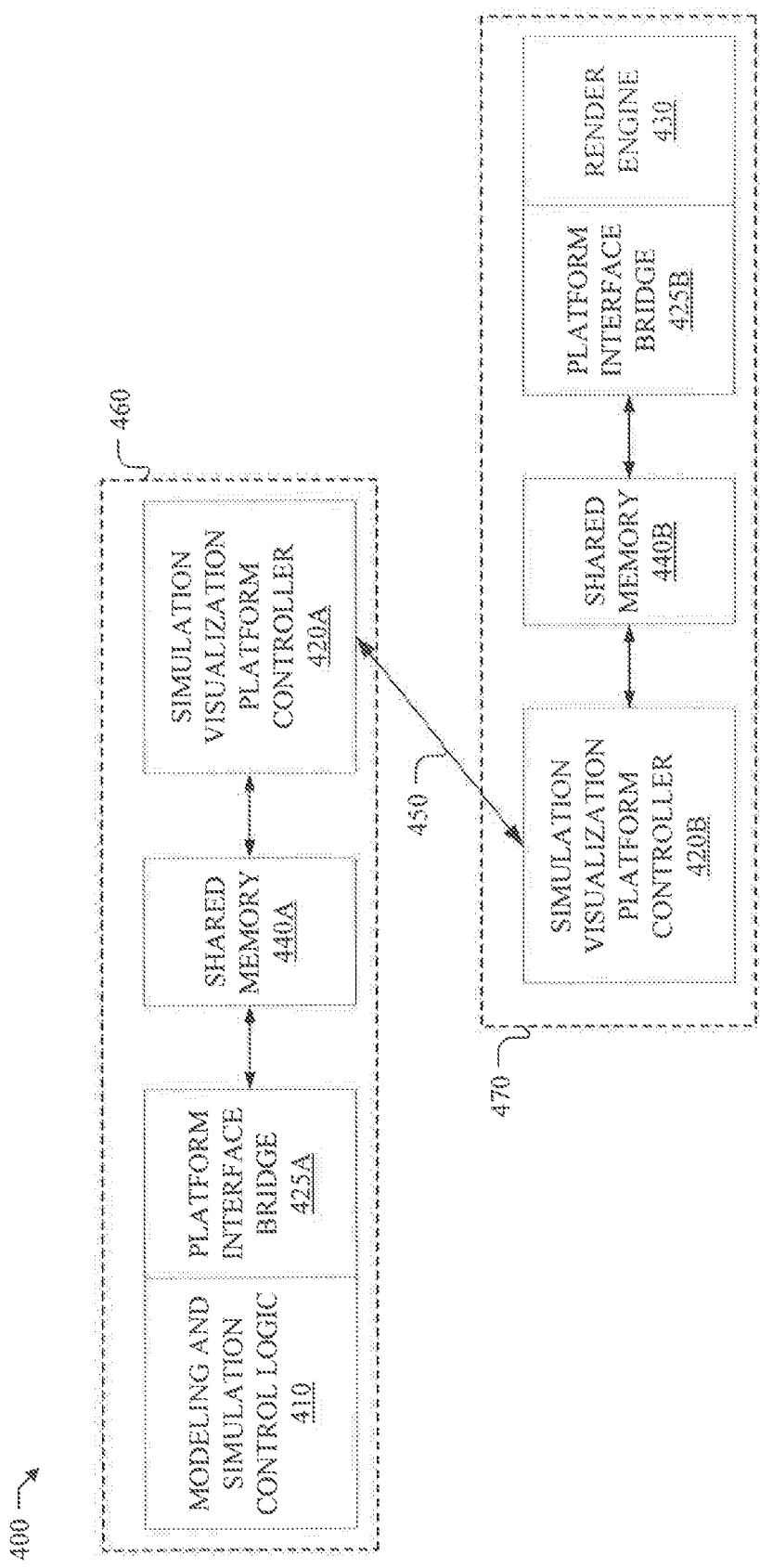
FIG. 4 illustrates a simulation visualization environment including multiple systems each having a respective simulation visualization platform controller, according to certain embodiments.

FIG. 4 illustrates a simulation visualization environment 400 including multiple systems each having a respective simulation visualization platform controller, according to certain embodiments. In the illustrated embodiment, system 460 includes modeling and simulation control logic 410 and system 470 includes render engine 430. System 460 also includes platform interface bridge 425A, simulation visualization platform controller 420A, and shared memory 440A. System 470 also includes platform interface bridge 425B, simulation visualization platform controller 420B, and shared memory 440B.

Although a single modeling and simulation control logic component 410 is illustrated within system 460 and a single render engine 430 is illustrated in system 470 simulation visualization environment 400 may include any number of modeling and simulation control logic components 410 and render engines 430, in any number of systems 460 or 470, in different embodiments. In some embodiments, system 460 or system 470 may include both a modeling and simulation control logic component 410 and a render engine 430, or any number of simulation control logic components 410 and/or render engines 430.

In some embodiments, modeling and simulation control logic component 410 may publish to shared memory 440A, through a defined platform bridge, key-value pairs representing outputs of a simulation. Simulation visualization platform controller 420A may obtain the key-value pairs representing simulation outputs and may communicate them over network communication interface 450 (e.g., an interface to a UDP network or to a network compliant with the Distributed Interactive Simulation (DIS) standard) to simulation visualization platform controller 420B for the benefit of render engine 430. In some embodiments. Simulation visualization platform controller 420A may perform unit conversions on some of the key-value pairs, if appropriate, prior to communicating them to simulation visualization platform controller 420B. In other embodiments, simulation visualization platform controller 420A may communicate the key-value pairs as received to simulation visualization platform controller 420B, after which simulation visualization platform controller 420B may perform any needed unit conversions.

In some embodiments, simulation visualization platform controller 420B may communicate the received (and, in some cases converted) key-value pairs to render engine 430 by writing them to shared memory 440B. Platform interface bridge 425B may, on behalf of render engine 430 retrieve the key-value pairs from shared memory 440B and communicate them to render engine 430 as native inputs to render engine 430, after which render engine 430 may render a visualization of the simulation outputs.

While FIG. 4 illustrates an example embodiment of a simulation visualization environment 400 in which key-value pairs are communicated from a modeling and simulation, control logic component 410 to a simulation visualization platform controller 420 by publishing the key-value pairs to a shared memory 440, in other embodiments, key-value pairs may be communicated from a modeling and simulation control logic component 410 to a simulation visualization platform controller 420 using other means. Similarly, while FIG. 4 illustrates an example embodiment of a simulation visualization environment 400 in which key-value pairs are communicated from, a simulation visualization platform controller 420 to a render engine 430 through a shared memory 440, in other embodiments, key-value pairs may be communicated from a simulation visualization platform controller 420 to a render engine 430 using other means.

For example, in some embodiments, a modeling and simulation control logic component 410 and/or a render engine 430 may exchange information with a simulation visualization platform controller 420 directly over a communication protocol such as a local data transport protocol or TCP/IP. In some embodiments, a platform interface bridge 425 may buffer incoming and/or outgoing key-value pairs for subsequent retrieval by the receiving entity.

While FIG. 4 illustrates a simulation visualization environment 400 that includes two computing systems, each of which includes a respective simulation visualization platform controller, in other embodiments, a simulation visualization environment in accordance with this disclosure may include any number of computing systems, each of which may include a respective simulation visualization platform controller and any number of modeling and simulation control logic components and/or render engines that collectively perform simulation visualization.

As previously noted, in some embodiments, the systems and method described herein may be applied to the design of an aircraft. In some embodiments, the application of the disclosed techniques to an aircraft design may allow flight control engineers to perform real-time airframe simulation and visualization, to evaluate modeling and simulation control logic and six degree-of-freedom flight inputs on their workstations prior to moving to a full vehicle simulator, or to simulate the execution of complex maneuvers on their workstations where prior scripting approaches were inaccurate and insufficient.

In some embodiments, the application of the disclosed techniques to an aircraft design may allow flight test engineers to rehearse and/or develop maneuvers on their workstations. In some embodiments, the application of the disclosed techniques to an aircraft design may allow pilots to rehearse and/or check maneuver conditions on their workstations prior to moving to a full vehicle simulator. In some embodiments, the application of the disclosed techniques to an aircraft design may contribute to flight safety operations by providing high-visual-fidelity playback of mishaps and/or other simulation data on engineering workstations.

While the disclosed techniques have been described using several examples involving simulation visualization for aircraft design, these techniques may also be applied to the design of other types of vehicles including, without limitation, ground vehicles, space vehicles, water vehicles, or other types of air vehicles. The disclosed techniques may also be applied to provide a platform for visualization of simulations involving the design of other types of technological products, the behavior of physical objects acted upon by various forces, or other processes or phenomena for which modeling and simulation applications are available. For example, the disclosed techniques may be applied to provide visualization for simulations of any type of mechanical or industrial product or process for which modeling and simulation control logic components are available by embedding a defined platform interface into the components to generate key-value pairs to be communicated to one or more render engines.

Figure 5:
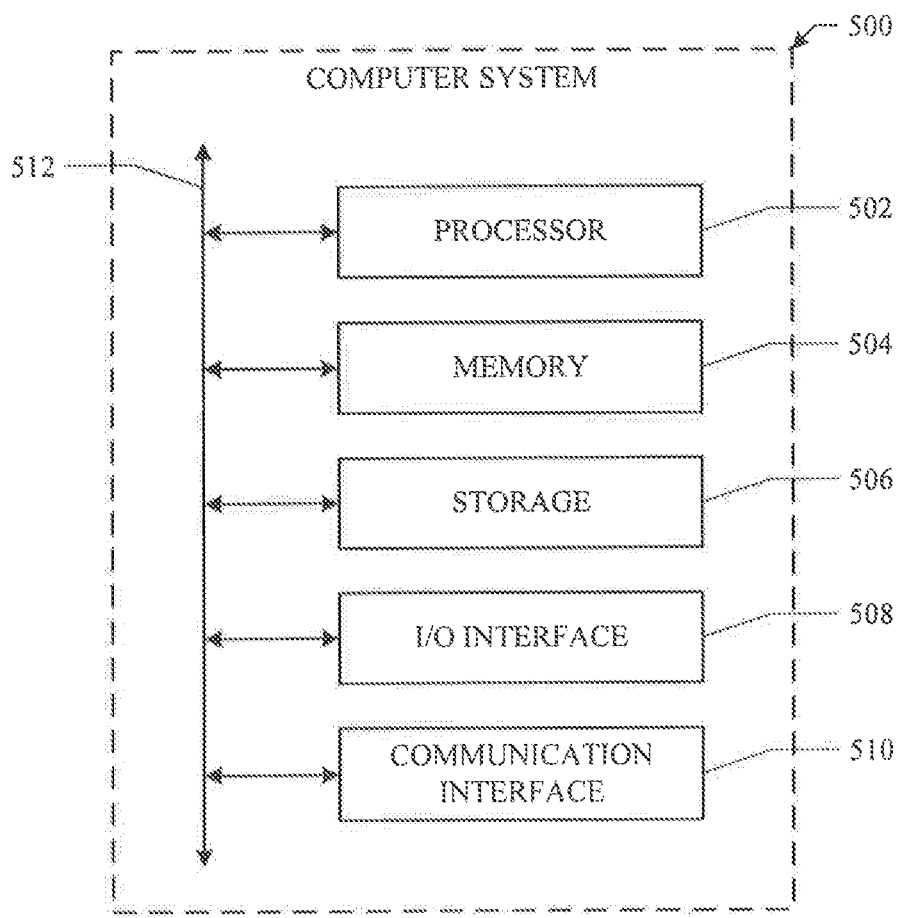
FIG. 5 illustrates a computer system where particular embodiments of the disclosure may be implemented.

FIG. 5 illustrates an example computer system 500. Computer system 500 may be utilized by system 100 illustrated in FIG. 1, or by system 460 or system 470 illustrated in FIG. 4. In particular embodiments, one or more computer systems 500 perform, one or more steps of one or more methods described or illustrated herein, including method 300 illustrated in FIG. 3. In particular embodiments, one or more computer systems 500 provide functionality described or illustrated herein, including functionality of one or more modeling and simulation control logic components, one or more render engines, one or more platform interface bridges, and/or one or more simulation visualization platform controllers or subsystems thereof. In particular embodiments, software running on one or more computer systems 500 performs one or more steps of one or more methods described or illustrated herein or provides functionality described or illustrated herein. Particular embodiments include one or more portions of one or more computer systems 500. Herein, reference to a computer system may encompass a computing device, and vice versa, where appropriate. Moreover, reference to a computer system may encompass one or more computer systems, where appropriate.

This disclosure contemplates any suitable number of computer systems 500. This disclosure contemplates computer system 500 taking any suitable physical form. As example and not by way of limitation, computer system 500 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 500 may include one or more computer systems 500; be unitary or distributed; span multiple locations; span multiple machines; span multiple data centers; or reside in a cloud, which may include one or more cloud components in one or more networks. Where appropriate, one or more computer systems 500 may perform without substantial spatial or temporal limitation one or more steps of one or more methods described or illustrated herein. As an example and not by way of limitation, one or more computer systems 500 may perform in real time or in batch mode one or more steps of one or more methods described or illustrated herein. One or more computer systems 500 may perform at different times or at different locations one or more steps of one or more methods described or illustrated herein, where appropriate.

In particular embodiments, computer system 500 includes a processor 502, memory 504, storage 506, an input/output (I/O) interface 508, a communication interface 510, and a bus 512. Although this disclosure describes and illustrates a particular computer system having a particular number of particular components in a particular arrangement, this disclosure contemplates any suitable computer system having any suitable number of any suitable components in any suitable arrangement.

In particular embodiments, processor 502 includes hardware for executing instructions, such as those making up a computer program. As an example and not by way of limitation, to execute instructions, processor 502 may retrieve (or fetch) the instructions from an internal register, an internal cache, memory 504, or storage 506; decode and execute them; and then write one or more results to an internal register, an internal cache, memory 504, or storage 506. In particular embodiments, processor 502 may include one or more internal caches for data, instructions, or addresses. This disclosure contemplates processor 502 including any suitable number of any suitable internal caches, where appropriate. As an example and not by way of limitation, processor 502 may include one or more instruction caches, one or more data caches, and one or more translation lookaside buffers (TLBs). Instructions in the instruction caches may be copies of instructions in memory 504 or storage 506, and the instruction caches may speed up retrieval of those instructions by processor 502. Data in the data caches may be copies of data in memory 504 or storage 506 for instructions executing at processor 502 to operate on; the results of previous instructions executed at processor 502 for access by subsequent instructions executing at processor 502 or for writing to memory 504 or storage 506; or other suitable data. The data caches may speed up read or write operations by processor 502. The TLBs may speed up virtual-address translation for processor 502. In particular embodiments, processor 502 may include one or more internal registers for data, instructions, or addresses. This disclosure contemplates processor 502 including any suitable number of any suitable internal registers, where appropriate. Where appropriate, processor 502 may include one or more arithmetic logic units (ALUs); be a multi-core processor; or include one or more processors 502. Although this disclosure describes and illustrates a particular processor, this disclosure contemplates any suitable processor.

In particular embodiments, memory 504 includes main memory for storing instructions for processor 502 to execute or data for processor 502 to operate on. The data may include initial conditions data, logged data exchanges (e.g., key-value pairs), user inputs received during a simulation visualization, and/or any other data associated with the applications within a simulation visualization environment or a particular simulation visualization run. As an example and not by way of limitation, computer system 500 may load instructions from storage 506 or another source (such as, for example, another computer system 500) to memory 504. Processor 502 may then load the instructions from, memory 504 to an internal register or internal cache. To execute the instructions, processor 502 may retrieve the instructions from the internal register or internal cache and decode them. During or after execution of the instructions, processor 502 may write one or more results (which may be intermediate or final results) to the internal register or internal cache. Processor 502 may then write one or more of those results to memory 504. In particular embodiments, processor 502 executes only instructions in one or more internal registers or internal caches or in memory 504 (as opposed to storage 506 or elsewhere) and operates only on data in one or more internal registers or internal, caches or in memory 504 (as opposed to storage 506 or elsewhere). One or more memory buses (which may each include an address bus and a data bus) may couple processor 502 to memory 504. Bus 512 may include one or more memory buses, as described below. In particular embodiments, one or more memory management units (MMUs) reside between processor 502 and memory 504 and facilitate accesses to memory 504 requested by processor 502. In particular embodiments, memory 504 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 504 may include one or more memories 504, where appropriate. Although this disclosure describes and illustrates particular memory, this disclosure contemplates any suitable memory.

In particular embodiments, storage 506 includes mass storage for data or instructions. As an example and not by way of limitation, storage 506 may include a hard disk drive (HDD), a floppy disk drive, flash memory, an optical disc, a magneto-optical disc, magnetic tape, or a Universal Serial Bus (USB) drive or a combination of two or more of these. Storage 506 may include removable or non-removable (or fixed) media, where appropriate. Storage 506 may be internal or external to computer system 500, where appropriate. In particular embodiments, storage 506 is non-volatile, solid-state memory. In particular embodiments, storage 506 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 506 taking any suitable physical form. Storage 506 may include one or more storage control units facilitating communication between processor 502 and storage 506, where appropriate. Where appropriate, storage 506 may include one or more storages 506. Although this disclosure describes and illustrates particular storage, this disclosure contemplates any suitable storage.

In particular embodiments, I/O interface 508 includes hardware, software, or both, providing one or more interfaces for communication between computer system 500 and one or more I/O devices. Computer system 500 may include one or more of these I/O devices, where appropriate. One or more of these I/O devices may enable communication between a person and computer system 500. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 508 for them. Where appropriate, I/O interface 508 may include one or more device or software drivers enabling processor 502 to drive one or more of these I/O devices. I/O interface 508 may include one or more I/O interfaces 508, where appropriate. Although this disclosure describes and illustrates a particular I/O interface, this disclosure contemplates any suitable I/O interface.

In particular embodiments, communication interface 510 includes hardware, software, or both providing one or more interfaces for communication (such as, for example, packet-based communication) between computer system 500 and one or more other computer systems 500 or one or more networks. As an example and not by way of limitation, communication interface 510 may include a network interface controller (NIC) or network adapter for communicating with an Ethernet or other wire-based, network or a wireless NIC (WNIC) or wireless adapter for communicating with a wireless network, such as a WI-FI network. This disclosure contemplates any suitable network and any suitable communication interface 510 for it. As an example and not by way of limitation, computer system 500 may communicate with an ad hoc network, a personal area network (PAN), a local area network (LAN), a wide area network (WAN), a metropolitan area network (MAN), or one or more portions of the Internet, or a combination of two or more of these. One or more portions of one or more of these networks may be wired or wireless. As an example, computer system 500 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 500 may include any suitable communication interface 510 for any of these networks, where appropriate. Communication interface 510 may include one or more communication interfaces 510, where appropriate. Although this disclosure describes and illustrates a particular communication interface, this disclosure contemplates any suitable communication interface.

In particular embodiments, bus 512 includes hardware, software, or both coupling components of computer system 500 to each other. As an example and not by way of limitation, bus 512 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 512 may include one or more buses 512, where appropriate. Although this disclosure describes and illustrates a particular bus, this disclosure contemplates any suitable bus or interconnect.

The components of computer system 500 may be integrated or separated. In some embodiments, components of computer system 500 may each be housed within a single chassis. The operations of computer system 500 may be performed by more, fewer, or other components. Additionally, operations of computer system 500 may be performed using any suitable logic that may comprise software, hardware, other logic, or any suitable combination of the preceding.

Herein, a computer-readable non-transitory storage medium or media may include one or more semiconductor-based or other integrated, circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system for simulation visualization, comprising:
one or more control logic components configured to model and simulate a physical product or process;
one or more render engines configured to generate visualizations of outputs of the one or more control logic components; and
a simulation visualization platform controller, the simulation visualization platform controller configured to:
  act as a third-party communications broker between the one or more control logic components and the one or more render engines, whereby communications between the one or more control logic components and the one or more render engines flow through the simulation visualization platform controller, wherein acting as the third-party communications broker between the one or more control logic components and the one or more render engines comprises:
    receiving a plurality of control signals from the one or more control logic components as key-value pairs;
    converting the received key-value pairs to different units; and
    passing the converted key-value pairs to the one or more render engines;
  determine, for a simulation visualization, initial conditions for at least one of:
    a given one of the control logic components; or
    a given one of the render engines;
  initiate execution of the given control logic component and the given render engine in accordance with the determined initial conditions;
  receive, during a simulation performed by the given control logic component, input from the given control logic component in accordance with a predefined interface for simulation visualization, the input representing one or more outputs of the given control logic component; and
  communicate the received input to the given render engine in accordance with the predefined interface for visualization by the given render engine.

2. The system of claim 1, wherein:
each of the one or more control logic components comprises a respective instance of a platform interface bridge configured to modify raw output of the control logic component for compliance with the predefined interface; and
each of the one or more render engines comprises a respective instance of the platform interface bridge configured to modify received input in compliance with the predefined interface to a native input format for the render engine.

3. The system of claim 1, wherein:
the simulation visualization platform controller comprises a human interface controller subsystem; and
to determine the initial conditions, the simulation visualization platform controller is configured to receive input specifying at least a portion of the initial conditions through the human interface controller subsystem.

4. The system of claim 1, wherein:
the system further comprises a memory in which one or more sets of initial conditions are stored, the sets of initial conditions including one or more of:
  a default set of initial conditions for the given control logic component;
  a default set of initial conditions for the given render engine;
  a set of initial conditions specified for use by the given control logic component in a previous simulation; or
  a set of initial conditions specified for use by the given render engine in a previous simulation; and
to determine the initial conditions, the simulation visualization platform controller is configured to retrieve one or more sets of initial conditions from the memory.

5. The system of claim 1, wherein:
the simulation visualization platform controller comprises a human interface controller subsystem communicatively coupled to one or more human interface devices; and
the simulation visualization platform controller is further configured to:
  receive, from a given human interface device through the human interface controller subsystem during the simulation, input specifying a value of an operating parameter or a control parameter of the given control logic component; and
  communicate the received input to the given control logic component to change a behavior of the simulation.

6. The system of claim 1, wherein the simulation visualization platform controller is further configured to:
receive, during the simulation, additional input from the given render engine in accordance with the predefined interface, the additional input representing feedback from the given render engine to the given control logic component; and
communicate the additional input to the given control logic component in accordance with the predefined interface.

7. The system of claim 1, wherein the simulation visualization platform controller comprises a unit conversions subsystem configured to translate at least a portion of the received input from a numerical representation compatible with the given control logic component to a numerical representation compatible with the given render engine.

8. The system of claim 1, wherein the simulation visualization platform controller comprises a data logging subsystem configured to store, in a memory, the received input as received from the given control logic component and the received input as communicated to the given render engine.

9. The system of claim 8, wherein the simulation visualization platform controller comprises a simulation visualization launch and replay controller configured to:
 perform the initiation of the execution of the given control logic component and the given render engine in accordance with the determined initial conditions;
 retrieve at least a portion of the received input as received from the given control logic component and stored by the data logging subsystem or at least a portion of the received input as communicated to the given render engine and stored by the data logging subsystem; and
 initiate a replay of the visualization by the given render engine using the at least a portion of the received input retrieved from the memory.

10. The system of claim 1, wherein the simulation visualization platform controller is further configured to:
 determine additional initial conditions for at least one of:
  another one of the control logic components; or
  another one of the render engines;
 initiate execution of the other control logic component or the other render engine in accordance with the determined additional initial conditions;
 receive input from the other control logic component in accordance with the predefined interface; and
 communicate the input received from the other control logic component to the given render engine or the other render engine in accordance with the predefined interface.

11. The system of claim 1, wherein:
 the system further comprises another simulation visualization platform controller, the other simulation visualization platform controller executing on a different physical computing system than a physical computing system on which the simulation visualization platform controller executes, the physical computing systems communicatively coupled to each other over a communication network;
 at least one of the control logic components other than the given control logic component or one of the render engines other than the given render engine executes on the different physical computing system; and
 the other simulation visualization platform controller is configured to:
  receive input from the given control logic component over the communication network and communicate the received input to the other render engine; or
  receive input from the other control logic component and communicate the received input to the given render engine over the communication network.

12. A computer-implemented method for simulation visualization by a simulation visualization platform controller, the method comprising:
 determining initial conditions for at least one of:
  a control logic component for modeling and simulating of a physical product or process; or
  a render engine for generating a visualization of outputs of the control logic component;
 initiating execution of the control logic component and the render engine in accordance with the determined initial conditions;
 acting as a third-party communications broker between the control logic component and the render engine, whereby communications between the control logic component and the render engine flow through the simulation visualization platform controller, wherein acting as the third-party communications broker between the control logic component and the render engine comprises:
  receiving a plurality of control signals from the control logic component as key-value pairs;
  converting the received key-value pairs to different units; and
  passing the converted key-value pairs to the render engine;
 receiving, during the simulating, input from the control logic component in accordance with a predefined interface for simulation visualization, the input representing one or more outputs of the control logic component; and
 communicating the received input to the render engine in accordance with the predefined interface for visualization by the render engine.

13. The method of claim 12, wherein the predefined interface for simulation visualization defines an input data block and an output data block.

14. The method of claim 12, wherein determining the initial conditions comprises receiving input specifying at least a portion of the initial conditions through a human interface mechanism or retrieving at least a portion of a set of initial conditions from a memory.

15. The method of claim 12, further comprising:
 storing, in a memory, the received input as received from the control logic component and the received input as communicated to the render engine;
 retrieving, from the memory, at least a portion of the received input as received from the control logic component or at least a portion of the received input as communicated to the render engine; and
 initiating a replay of the visualization by the render engine using the at least a portion of the received input retrieved from the memory.

16. The method of claim 12, further comprising:
 determining additional initial conditions for at least one of:
  another control logic component; or
  another render engine;
 initiating execution of the other control logic component or the other render engine in accordance with the determined additional initial conditions;
 receiving input from the control logic component or the other control logic component in accordance with the predefined interface; and
 communicating the input received from the control logic component or the other control logic component to the render engine or the other render engine in accordance with the predefined interface.

17. A non-transitory computer-readable medium comprising software, the software when executed by one or more processing units operable to perform operations comprising:
 determining initial conditions for at least one of:
  a control logic component for modeling and simulating of a physical product or process; or
  a render engine for generating a visualization of outputs of the control logic component;
 initiating execution of the control logic component and the render engine in accordance with the determined initial conditions;
 acting as a third-party communications broker between the control logic component and the render engine, whereby communications between the control logic component and the render engine flow through the third-party communications broker, wherein acting as the third-party communications broker between the control logic component and the render engine comprises:
  receiving a plurality of control signals from the control logic component as key-value pairs;
  converting the received key-value pairs to different units; and
  passing the converted key-value pairs to the render engine;
receiving, during the simulating, input from the control logic component in accordance with a predefined interface for simulation visualization, the input representing one or more outputs of the control logic component; and
communicating the received input to the render engine in accordance with the predefined interface for visualization by the render engine.

18. The non-transitory computer-readable medium of claim 17, wherein the predefined interface for simulation visualization defines an input data block and an output data block.

19. The non-transitory computer-readable medium of claim 17, the operations further comprising:
  determining additional initial conditions for at least one of:
    another control logic component; or
    another render engine;
  initiating execution of the other control logic component or the other render engine in accordance with the determined additional initial conditions;
  receiving input from the control logic component or the other control logic component in accordance with the predefined interface; and
  communicating the input received from the control logic component or the other control logic component to the render engine or the other render engine in accordance with the predefined interface.

* * * * *